(12) United States Patent
Paik

(10) Patent No.: US 7,906,382 B2
(45) Date of Patent: Mar. 15, 2011

(54) METHOD OF CRYSTALLIZING AMORPHOUS SEMICONDUCTOR THIN FILM AND METHOD OF FABRICATING POLY-CRYSTALLINE THIN FILM TRANSISTOR USING THE SAME

(75) Inventor: Woon Suh Paik, Gyeonggi-do (KR)

(73) Assignee: Neopoly Inc., Seoul (KR)

( * ) Notice: Subject to any disclaimer, the term of this patent is extended or adjusted under 35 U.S.C. 154(b) by 670 days.

(21) Appl. No.: 11/157,878

(22) Filed: Jun. 22, 2005

(65) Prior Publication Data

US 2005/0287726 A1 Dec. 29, 2005

(30) Foreign Application Priority Data

Jun. 29, 2004 (KR) .................. 10-2004-0049402

(51) Int. Cl.
*H01L 21/84* (2006.01)
*H01L 21/00* (2006.01)
(52) U.S. Cl. ............ 438/166; 257/E21.133; 438/486
(58) Field of Classification Search .......... 438/166, 438/486; 257/E21.133
See application file for complete search history.

(56) References Cited

U.S. PATENT DOCUMENTS 6,562,667 B1 * 5/2003 Hwang et al. .......... 438/149
2001/0014496 A1 * 8/2001 Zhang et al. .......... 438/197

FOREIGN PATENT DOCUMENTS

JP 04076970 A * 3/1992

* cited by examiner

*Primary Examiner* — Asok K Sarkar
*(74) Attorney, Agent, or Firm* — Rosenberg, Klein & Lee

(57) ABSTRACT

A method of crystallizing an amorphous semiconductor thin film formed on a substrate is provided. The method includes the steps of: forming a gate insulation film and a gate electrode on an amorphous semiconductor thin film; locally forming first and second crystallization induced metal patterns for inducing crystallization of the amorphous semiconductor thin film, on part of the amorphous semiconductor thin film spaced at a predetermined off-set distance from the gate insulation film; ion-injecting impurities into the substrate to thus define a source/drain region; forming a protection film on the whole surface of the substrate; and heat-treating the substrate in the air to thereby crystallize the amorphous semiconductor thin film. As a result, the protection film such as an oxide film is coated in advance before a metal induced lateral crystallization (MILC) heat treatment when the amorphous semiconductor thin film is crystallized, to thereby enabling the MILC heat treatment even in the air as well as under the inert gas, hydrogen, or vacuum atmosphere, and to thus save a cost for maintaining a heat treatment atmosphere.

5 Claims, 4 Drawing Sheets

METHOD OF CRYSTALLIZING AMORPHOUS SEMICONDUCTOR THIN FILM AND METHOD OF FABRICATING POLY-CRYSTALLINE THIN FILM TRANSISTOR USING THE SAME

BACKGROUND OF THE INVENTION

1. Field of the Invention

The present invention relates to a method of crystallizing an amorphous semiconductor thin film and a method of fabricating a poly-crystalline thin film transistor using the same, and more particularly, to a method of crystallizing an amorphous semiconductor thin film and a method of fabricating a poly-crystalline thin film transistor using the same, in which a protection film such as an oxide film is coated in advance before a metal induced lateral crystallization (MILC) heat treatment when an amorphous semiconductor thin film is crystallized using a MILC method, to thereby enabling the MILC heat treatment even in the air.

2. Description of the Related Art

In a method of forming a poly-crystalline silicon film which is used as a semiconductor layer of a thin film transistor, an amorphous silicon film is deposited on a substrate, and then processed at a predetermined temperature, to thus crystallize the amorphous silicon film into a poly-crystalline silicon film. Here, a metal induced lateral crystallization (MILC) method, a solid phase crystallization (SPC) method, and an eximer laser annealing (ELA) method are known as the amorphous silicon film crystallization method.

Among them, the MILC method does not only enable a batch processing using a conventional inexpensive heat treatment facility but also has many advantages of a relatively low processing temperature and a relatively short processing time.

A conventional method of fabricating a thin film transistor using a MILC method will follow with reference to FIGS. 1A through 1E.

FIGS. 1A through 1E are cross-sectional views for explaining a conventional thin film transistor fabrication method using a MILC technology, respectively.

Referring to FIG. 1A, an amorphous silicon film is deposited on an insulation substrate 10, and the amorphous silicon film is patterned using a semiconductor layer forming mask (not shown), to thereby form a semiconductor layer 11.

Referring to FIG. 1B, a gate oxide film and a gate electrode material are deposited on the substrate 10, and then sequentially patterned using a gate forming mask (not shown) to thereby form a gate electrode 13 and a gate insulation film 12.

Referring to FIG. 1C, a photosensitive film is formed on the whole surface of the substrate, and then a photosensitive film pattern 14 which is slightly larger than a gate pattern is formed using an off-set mask (not shown). Then, a crystallization induced metal film 15 for metal induced lateral crystallization (MILC) (hereinafter referred to as a "MILC metal film") such as nickel (Ni) is deposited on the entire surface of the substrate.

Referring to FIG. 1D, the photosensitive film pattern 14 is removed by using a lift-off method, and thus the gate electrode 13 and the off-set portions 11a and 11b of the semiconductor layer 11 are exposed. Then, high-concentration impurities are ion-injected onto the substrate to thereby form a source region 11S and a drain region 11D.

Thereafter, referring to FIG. 1E, a MILC heat treatment is performed on the substrate at 400° C. through 600° C. under the inert gas, hydrogen, or vacuum atmosphere, to thereby crystallize the amorphous silicon film of the semiconductor layer 11 into a poly-crystalline silicon film. In this case, a portion contacting the metal film 15 is crystallized by a metal induced crystallization (MIC) method, and off-set portions which do not contact the metal film 15 and a channel region 11C below the gate insulation film 12 are crystallized by a metal induced lateral crystallization (MILC) method.

Referring to FIG. 1F, an interlayer insulation film 16 is deposited on the substrate 10. Then, contact holes 17 with respect to the gate electrode 13, the source region 11S and the drain region 11D are formed using a contact forming mask (not shown). Then, a metal-wiring metal film is deposited and then patterned using a metal-wiring forming mask (not shown) to thereby form a metal-wiring pattern 18.

As described above, a MILC heat treatment is performed at a state where amorphous silicon is exposed in the case of a conventional thin film transistor fabrication method using the MILC method. Therefore, the heat treatment is performed under an inert gas atmosphere such as nitrogen or argon, under a reducing gas atmosphere such as hydrogen, or under a vacuum atmosphere. Thus, tremendous expenses are required in order to maintain the above-described atmosphere. In particular, as size of the substrate becomes large, the maintenance cost for the atmosphere cannot but increase by geometric progression.

SUMMARY OF THE INVENTION

To solve the above problems, it is an object of the present invention to provide a method of crystallizing an amorphous semiconductor thin film and a method of fabricating a poly-crystalline thin film transistor using the same, in which a protection film such as an oxide film is coated in advance before performing a metal induced lateral crystallization (MILC) heat treatment when an amorphous semiconductor thin film is crystallized using a MILC method, to thereby enabling the MILC heat treatment even in the air without performing an atmosphere heat treatment with tremendous expenses.

To accomplish the above object of the present invention, according to an aspect of the present invention, there is provided a method of crystallizing an amorphous semiconductor thin film formed on a substrate, the amorphous semiconductor thin film crystallization method comprising the steps of: forming a gate insulation film and a gate electrode on an amorphous semiconductor thin film; locally forming first and second crystallization induced metal patterns for inducing crystallization of the amorphous semiconductor thin film, on part of the amorphous semiconductor thin film spaced at a predetermined off-set distance from the gate insulation film; ion-injecting impurities into the substrate to thus define source/drain regions; forming a protection film on the whole surface of the substrate; and heat-treating the substrate in the air to thereby crystallize the amorphous semiconductor thin film.

In the present invention, an interlayer insulation film can be used as the protection film instead of forming a separate film. In this case, the MILC heat treatment is performed before forming contact holes, in which case an additional process is not required.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

A preferred embodiment of the present invention will be described with reference to the accompanying drawings.

Referring to FIGS. 2A through 2G, a method of crystallizing an amorphous semiconductor thin film using a MILC method and a method of fabricating a thin film transistor using the same, according to an embodiment of the present invention will be described below.

Figure 1A:
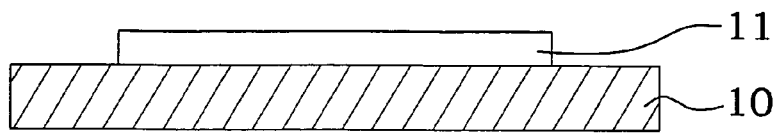
FIGS. 1A through 1F are cross-sectional views for explaining a conventional method of fabricating a poly-crystalline thin film transistor using a metal induced lateral crystallization (MILC) method.
Figure 1B:
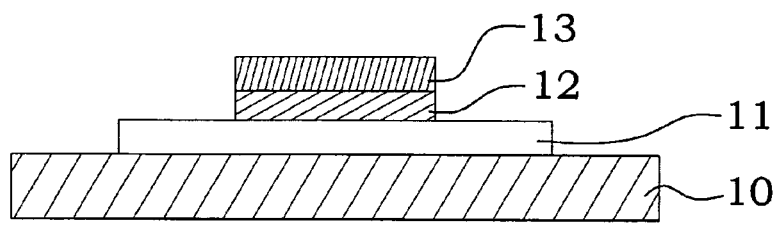
Figure 1C:
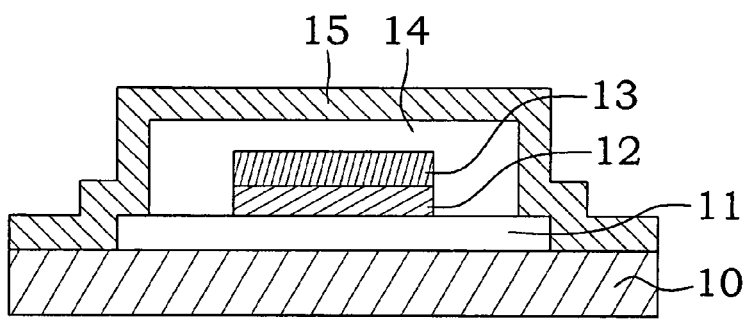
Figure 1D:
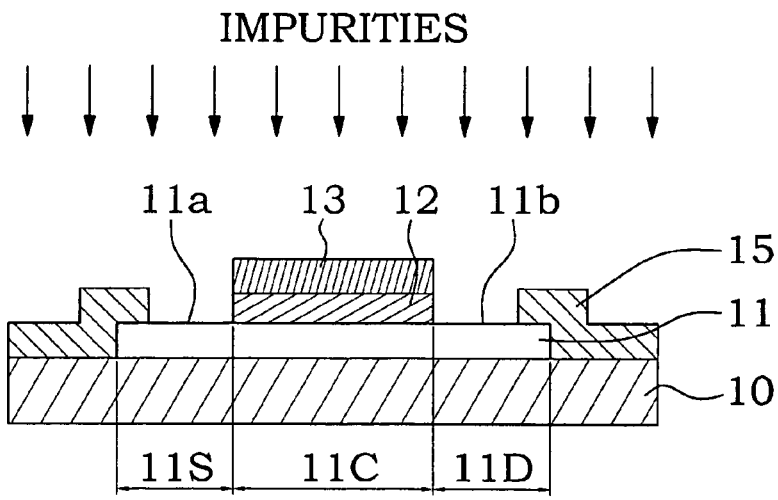
Figure 1E:
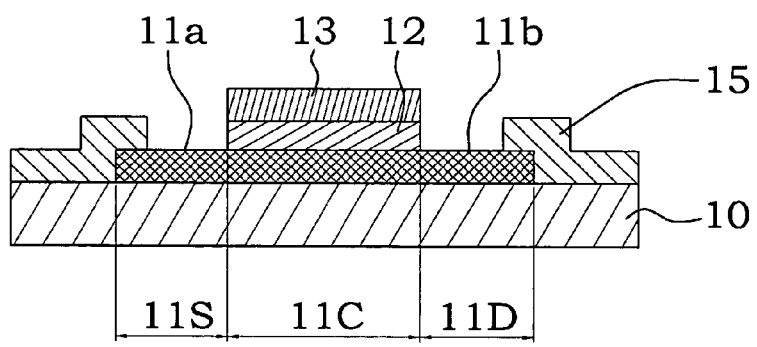
Figure 1F:
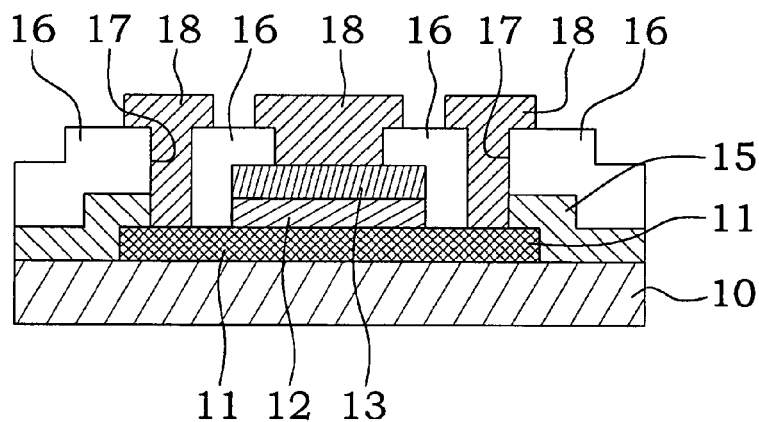
Figure 2A:
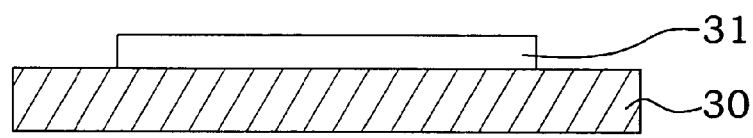
FIGS. 2A through 2F are cross-sectional views for explaining a method of fabricating a poly-crystalline thin film transistor using a MILC method to an embodiment of the present invention.

First, referring to FIG. 2A, an amorphous semiconductor film, for example, an amorphous silicon film is deposited on a transparent insulation substrate 30, and then the amorphous silicon film is patterned using a semiconductor layer forming mask (not shown), to thereby form a semiconductor layer 31.

Figure 2B:
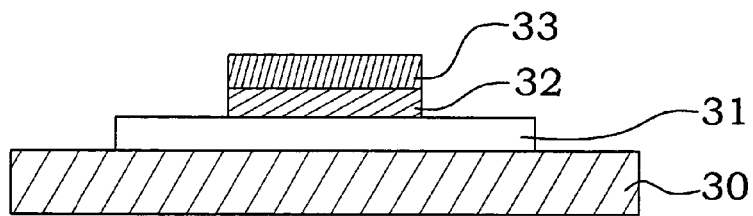

Then, referring to FIG. 2B, a gate oxide film and a gate electrode metal material are sequentially deposited on the substrate 30, and then patterned using a gate forming mask (not shown) to thereby form a gate electrode 33 and a gate insulation film 32.

Figure 2C:
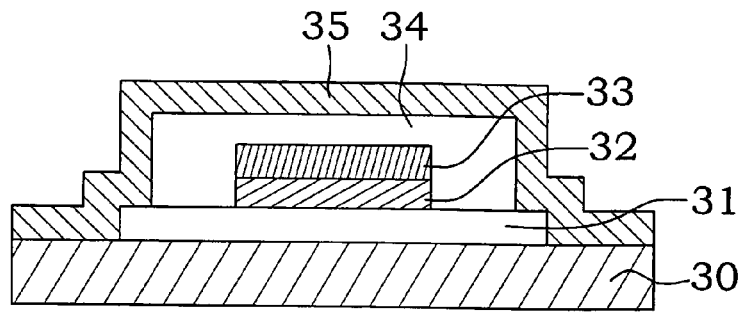

Referring to FIG. 2C, a photosensitive film is formed on the whole surface of the substrate, and then a photosensitive film pattern 34 which is slightly larger than a gate pattern is formed using an off-set mask (not shown). Then, a crystallization induced metal film 35 for metal induced lateral crystallization (MILC) (hereinafter referred to as a "MILC metal film") is deposited on the entire surface of the substrate. As a result, the MILC metal film 35 contacts partially an exposed source region and an exposed drain region of the semiconductor layer 31.

The MILC metal film 35 is deposited with a thickness of 10~10,000 Å, preferably, 10~200 Å, on the insulation substrate 30 including the semiconductor layer 31, by any one of sputtering, evaporation by heating, PECVD (Plasma Enhanced Chemical Vapor Deposition), and a solution coating. Here, any one selected from the group consisting of Ni, Pd, Ti, Ag, Au, Al, Sn, Sb, Cu, Co, Cr, Mo, Tr, Ru, Rh, Cd, and Pt is used as the applicable material of the metal film 35.

Figure 2D:
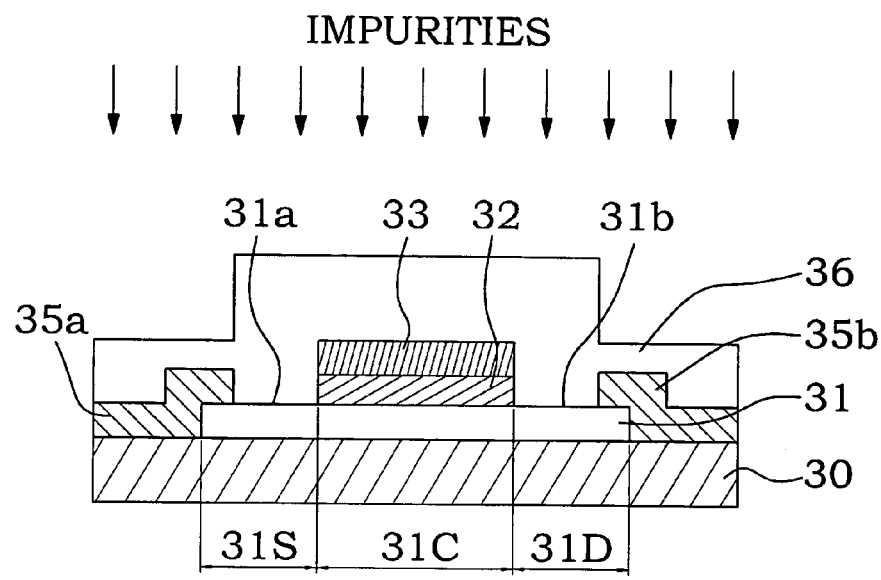

Thereafter, the photosensitive pattern 34 on the substrate is removed by a lift-off method. Then, as shown in FIG. 2D, only MILC metal films 35a and 35b partially contacting the source/drain regions 31S and 31D remain, while the other metal film is removed. Accordingly, part of the semiconductor layer 31 between the gate insulation film 32 and the MILC metal films 35a and 35b is exposed. That is, off-set portions 31a and 31b of the source/drain regions 31S and 31D are exposed.

After the gate electrode 33 and the off-set portions 31a and 31b of the semiconductor layer 31 are exposed by removing the photosensitive pattern 34, high-concentration impurities are ion-injected in order to make the semiconductor layer 31 into a desired conductive type using the gate electrode 33 as a mask, to thereby form a source region 31S and a drain region 31D. Then, an interlayer insulation film 36 is deposited on the entire surface of the substrate as a protection film for protecting the semiconductor layer 31, the gate electrode 33, and the gate insulation film 32, all of which are exposed at the time of performing a heat treatment. A silicon oxide film or a silicon nitride film is used as the interlayer insulation film 36.

Figure 2E:
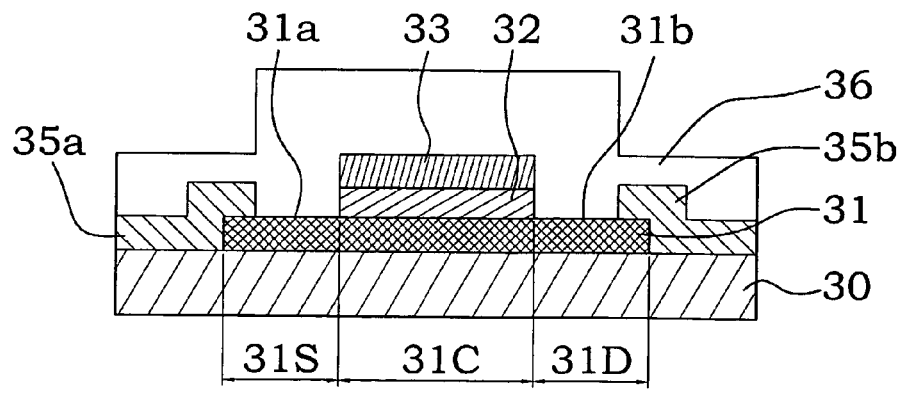

Referring to FIG. 2E, the substrate is heat-treated by a MILC method in the air at a temperature of 400° C. through 600° C. Accordingly, the amorphous silicon film of the semiconductor layer 31 is crystallized into a poly-crystalline silicon film 31 and simultaneously the ion-injected impurities are activated. The MILC heat treatment can be executed in all facilities which can apply heat including a rapid or linear heat treatment by lamps, or a scan heat treatment by laser, as well as a general tubular furnace. Of course, the heat treatment can be executed under the inert gas, hydrogen, or vacuum atmosphere, as well as in the air. Here, since the semiconductor layer 31, the gate oxide film 32, and the gate electrode 33 are protected by the interlayer insulation film 36, they can be prevented from being oxidized at the time of performing heat treatment.

Figure 2F:
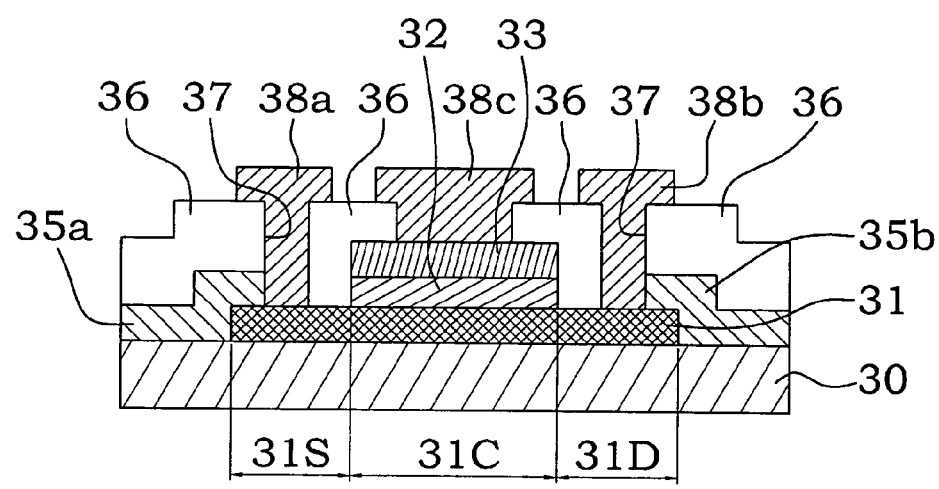

Referring to FIG. 2F, contact holes 37 with respect to the source region 31S, the drain region 31D, and the gate electrode 33 are formed in the interlayer insulation film 36 on the substrate using a contact mask (not shown), and then a wiring metal film is deposited thereon, and patterned using a metal wiring mask (not shown), to thereby form source, drain and gate metal wires 38a, 38b and 38c.

In this embodiment, a protection film is not additionally formed but the interlayer insulation film is used as a protection film. However, a particular silicon oxide film or nitride film can be formed as a protection film, and then a crystallization heat treatment can be executed using the silicon oxide film or nitride film, in which case an interlayer insulation can be additionally deposited. In this case, the protection film and the interlayer insulation film can be formed with the same or different films.

The silicon oxide film is deposited by a PECVD method using for example $SiH_4$, $N_2O$, or an argon gas as a source gas. The silicon nitride film is deposited by the PECVD method using $SiH_4$, $NH_3$, $N_2$, or $H_2$ gas as a source gas. The thickness of the protection film is made of 500 Å through 3,000 Å, preferably, 1,000 Å through 2,000 Å.

As described above, all of the source, drain and gate of the thin film transistor are covered with the protection film before performing a MILC heat treatment, in the present invention. Accordingly, although the MILC heat treatment is executed in the air as well as under the inert gas, hydrogen, or vacuum atmosphere, the thin film transistor can be prevented from oxidized. Thus, cost for forming and maintaining a heat treatment environment can be reduced.

As described above, the preferable embodiment of the present invention has been described with reference to the accompanying drawings. However, the present invention is not limited to the above-described embodiment. It is apparent to one who has an ordinary skill in the art that there may be many modifications and variations within the same technical spirit of the invention.

What is claimed is:

1. A method of crystallizing an amorphous semiconductor thin film formed on a substrate, the amorphous semiconductor thin film crystallization method comprising the steps of:

forming a gate insulation film and a gate electrode on the amorphous semiconductor thin film;

locally forming first and second crystallization induced metal patterns for inducing crystallization of the amorphous semiconductor thin film, on part of the amorphous semiconductor thin film spaced at a predetermined off-set distance from the gate insulation film;

ion-injecting impurities into the substrate to thus define a source/drain region;

forming a interlayer insulation film on the entire surface of the substrate as a protection film; and heat-treating the substrate in the air subsequent to the formation of the interlayer insulation film on the surface of the substrate to thereby crystallize the amorphous semiconductor thin film.

2. The amorphous semiconductor thin film crystallization method according to claim 1, wherein the protection film is formed of at least one of a silicon oxide film and a silicon nitride film.

3. The amorphous semiconductor thin film crystallization method according to claim 1, wherein the step of locally forming first and second crystallization induced metal patterns comprises the sub-steps of: forming a photosensitive film pattern which is slightly larger than the gate pattern in the periphery of the gate electrode on the entire surface of the substrate; depositing a crystallization induced metal film on the entire surface of the substrate; and removing the photosensitive film pattern on the substrate by a lift-off method, to thereby make the first and second crystallization induced metal patterns partially contacting the source and drain regions remain while exposing the gate electrode and the off-set portions of the semiconductor layer.

4. A method of fabricating a poly-crystalline thin film transistor comprising the steps of:

forming an amorphous semiconductor thin film on a substrate;

forming a gate insulation film and a gate electrode on the amorphous semiconductor thin film;

locally forming first and second crystallization induced metal patterns for inducing crystallization of the amorphous semiconductor thin film, on part of the amorphous semiconductor thin film spaced at a predetermined off-set distance from the gate insulation film;

ion-injecting impurities into the substrate to thus define source/drain regions;

forming a protection film on the whole surface of the substrate;

heat-treating the substrate in the air subsequent to the formation of the protection film on the surface of the substrate to thereby crystallize the amorphous semiconductor thin film;

forming contact holes with respect to the source/drain regions using the protection film as an interlayer insulation film; and forming metal wires on the interlayer insulation film.

5. The poly-crystalline thin film transistor fabrication method according to claim 4, further comprising a step of forming an additional interlayer film on the protection film after performing the crystallization heat treatment.

* * * * *